United States Patent
Park et al.

(10) Patent No.: US 6,929,999 B2
(45) Date of Patent: Aug. 16, 2005

(54) METHOD OF MANUFACTURING SEMICONDUCTOR DEVICE WITH CONTACT BODY EXTENDING IN DIRECTION OF BIT LINE TO CONTACT STORAGE NODE

(75) Inventors: Je-Min Park, Kyungki-do (KR); Yoo-Sang Hwang, Kyungki-do (KR)

(73) Assignee: Samsung Electronics Co., Ltd., Suwon (KR)

(*) Notice: Subject to any disclaimer, the term of this patent is extended or adjusted under 35 U.S.C. 154(b) by 81 days.

(21) Appl. No.: 10/759,802

(22) Filed: Jan. 15, 2004

(65) Prior Publication Data

US 2004/0147114 A1 Jul. 29, 2004

(30) Foreign Application Priority Data

Jan. 16, 2003 (KR) ................. 10-2003-0003001

(51) Int. Cl.[7] .................................. H01L 21/8242
(52) U.S. Cl. ....................... 438/253; 438/396
(58) Field of Search ................. 438/238–240, 438/253–256, 381, 396–399

(56) References Cited

U.S. PATENT DOCUMENTS 5,049,520 A * 9/1991 Cathey ............. 438/443
5,378,906 A    1/1995 Lee
6,352,890 B1   3/2002 Sutcliffe
6,383,866 B1   5/2002 Mizukoshi et al.
6,396,096 B1   5/2002 Park et al.
2002/0027259 A1 3/2002 Ikemasu et al.
2002/0068387 A1 6/2002 Tran

FOREIGN PATENT DOCUMENTS

GB      2 392 311 A    2/2004

* cited by examiner

Primary Examiner—H. Jey Tsai
(74) Attorney, Agent, or Firm—Marger Johnson & McCollom, P.C.

(57) ABSTRACT

A method of manufacturing a semiconductor device with contact bodies that extend in the direction of bit lines to contact storage nodes includes forming band-type openings by selectively etching an insulating layer that covers the bit lines. The band-type openings extend in a lengthwise direction of the gate lines to expose the first contact pads and have portions that protrude in a lengthwise direction of the bit lines. The method also includes forming a conductive layer on the insulating layer that fills the band-type openings and is electrically connected to the first contact pads. The conductive layer is then patterned to separate the conductive layer into individual storage node contact bodies that extend in a lengthwise direction of the bit lines. Storgage nodes are then formed on the storage node contact bodies.

25 Claims, 15 Drawing Sheets

METHOD OF MANUFACTURING SEMICONDUCTOR DEVICE WITH CONTACT BODY EXTENDING IN DIRECTION OF BIT LINE TO CONTACT STORAGE NODE

CROSS REFERENCE TO RELATED APPLICATIONS

This application claims priority from Korean Patent Application No. 2003-03001, filed on Jan. 16, 2003, in the Korean Intellectual Property Office, the contents of which are incorporated herein in their entirety by reference.

BACKGROUND OF THE INVENTION

1. Field of the Invention

This disclosure relates to semiconductor devices, and more particularly, to a method of manufacturing a semiconductor device that has contact bodies that extend in the bit line direction in order to contact storage nodes of a capacitor that are arranged in a zigzag manner in the word line direction.

2. Description of the Related Art

With advancements in techniques for manufacturing semiconductor devices, the sizes of transistors have decreased and the integration density of semiconductor devices has increased. Thus, the sizes of contact bodies used for electrical connection of layers have also decreased. Above all, in dynamic random access memories (DRAMs), forming capacitors in an 8F2-type strait active region becomes more complicated with the decrease in contact size. In a typical DRAM, in one plane, strait-type storage nodes of a capacitor are arranged in a lengthwise direction of an active region.

To meet a required capacitance, a typical DRAM includes a capacitor with cylindrical storage nodes, of which both the inner and outer surfaces can be used. However, highly integrated DRAM devices with a reduced design rule impede formation of a capacitor having a sufficient bottom critical dimension (CD). Thus, research for DRAMs securing a sufficient capacitance has progressed. An example is disclosed in U.S. Pat. No. 5,378,906 to Hee G. Lee, dated Jan. 3, 1995, entitled "Dynamic Random Access Memory having improved layout."

Since the bottom of a storage node of a capacitor has a decreased CD, building cylindrical storage nodes that do not lean becomes very complicated. The leaning or the collapse of storage nodes results in contact fails between adjacent storage nodes, thus causing 2-bit fails. Cylindrical storage nodes, arranged as a strait type, are very apt to lean or to collapse.

To prevent leaning or the collapse of storage electrodes, either increasing the bottom CDs of storage electrodes or decreasing the height of the electrode is required. However, when the design rule of devices is defined, increasing the bottom CD to be greater than the design rule is very difficult. Also, storage nodes having a small height make it impossible to obtain desired capacitance.

Considering the above restrictions, the best way to overcome the collapse of storage nodes would be to change the arrangement of the storage nodes. The collapse of storage nodes is closely related to the very narrow interval between adjacent storage nodes that are arranged in a strait type. Accordingly, changing the arrangement or sectional shape of storage nodes may be a solution for the collapse of storage nodes. Nevertheless, changing the arrangement of storage nodes is extremely difficult in a strait-type active region structure where active regions extend in one direction.

In such a strait-type active region structure, since active regions and storage nodes naturally overlap each other on a semiconductor substrate, forming or aligning contact bodies required for electrically connecting the active regions and the storage nodes becomes very easy. However, if the arrangement of storage nodes is changed, the storage nodes and the active regions do not overlap each other. In this case, the contact bodies used for electrically connecting the storage nodes and the active regions cannot be easily formed or aligned. As a result, electrical connection between the storage nodes and the active region cannot be sufficiently secured.

Embodiments of the invention address these and other disadvantages of the conventional art.

SUMMARY OF THE INVENTION

Embodiments of the invention provide methods of manufacturing a semiconductor device with contact bodies extending in the direction of bit lines in order to secure reliable electrical connection between active regions and storage nodes. To overcome the collapse of cylindrical storage nodes, the arrangement or sectional shape of the storage nodes is changed to secure an increased CD of the bottoms of the storage nodes. Thus, the storage nodes may be positioned in a zigzag fashion relative to the active regions on a semiconductor device.

BRIEF DESCRIPTION OF THE DRAWINGS

The above and other features and advantages of the invention will become more apparent by describing in detail preferred embodiments thereof with reference to the attached drawings in which.

DETAILED DESCRIPTION OF THE PREFERRED EMBODIMENTS

Figure 1A:
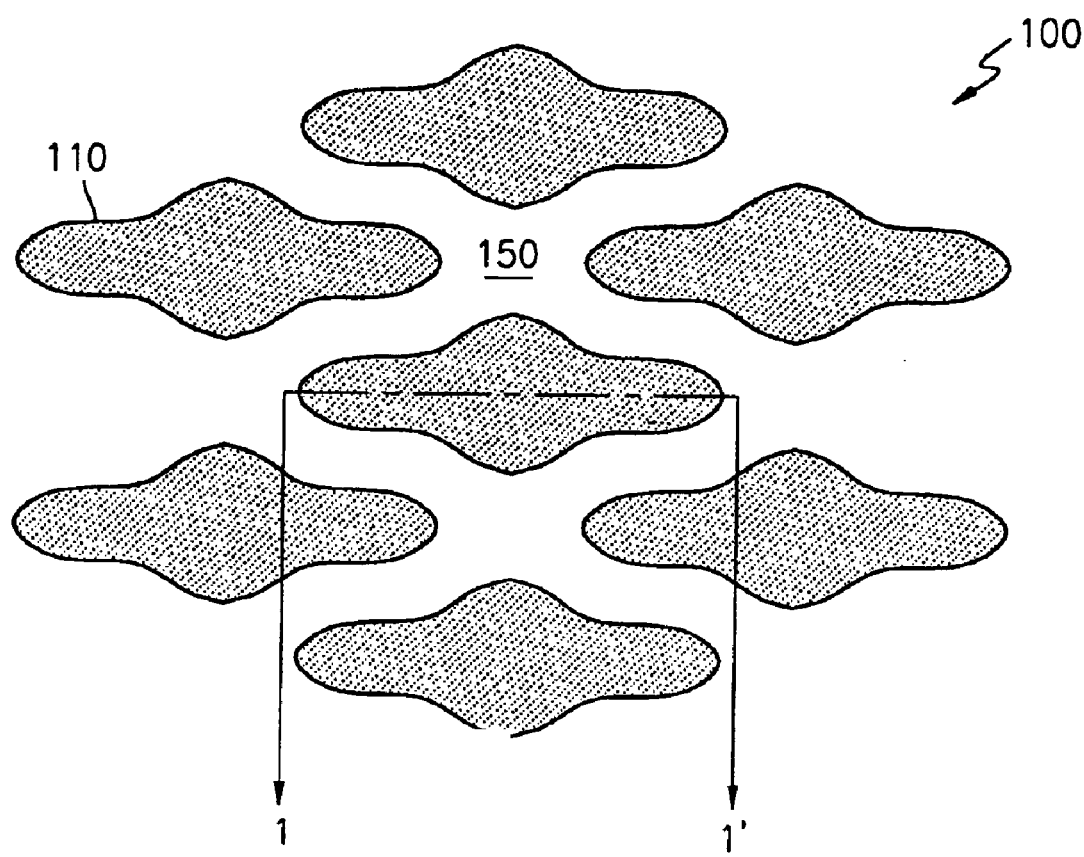
FIGS. 1A, 2A, 3A, 4A, 5A, 6A, 7A, 8A, and 9A are plan views illustrating a method of manufacturing a semiconductor device according to an embodiment of the invention.

The invention will now be described more fully with reference to the accompanying drawings, in which preferred embodiments of the invention are shown.

In the present invention, in a sectional view, storage electrodes are formed in the shape of square cylinders. Also, the storage nodes are arranged to be zigzag in a lengthwise direction of a bit line to a lengthwise direction of a word line. In this case, it is difficult to secure a sufficiently overlapped portion between the storage node and an active region of a semiconductor substrate, even though the storage nodes secure zigzag portions or slanted portions in a lengthwise direction of the bit lines. Accordingly, reliable electrical connection between the active region and the storage nodes cannot be achieved.

According to embodiments of the invention, storage node contact bodies extending in a lengthwise direction of the bit lines are proposed to traverse the insufficient alignment margin. The storage node contact bodies can be in contact with storage nodes having zigzag portions in the direction of the bit lines, forming a sufficient interface. Thus, reliable electrical connection between the active region and the storage nodes is enabled.

Specifically, a connection structure required for electrically connecting storage nodes of a capacitor to a semiconductor substrate includes buried contacts (BCs), i.e., storage node contact bodies, as well as BC pads contacting the surface of an active region of the semiconductor substrate. Here, even if the storage nodes are arranged to be zigzag in a lengthwise direction of the bit lines or word lines (e.g., gate lines), that is, even if the storage nodes are arranged in a direction diagonal to the lengthwise direction of the bit lines or word lines, in order to secure sufficient contact areas between the storage nodes and the storage node contact bodies, the storage node contact bodies extend in a lengthwise direction of the bit lines.

According to embodiments of the invention, to form such storage node contact bodies, zigzag band-type openings are formed without using additional layers so as to lead the storage node contact bodies to extend in a lengthwise direction of bit lines. In a case where the zigzag band-type openings are formed, a photolithographic process for forming the openings can be performed under alleviated or relatively low-level conditions for process margin and resolution. Also, when a conductive layer filling the openings is separated into individual storage node contact bodies, a sufficient process margin can be secured using a self-aligned contact (SAC) process.

Further, the openings are formed by using taper etching to have oblique sidewalls. This allows prevention of a short between the storage node contact bodies and contact bodies, e.g., direct contacts (DCs) and direct contact (DC) pads, that are required for electrically connecting bit lines to an active region of a semiconductor substrate. Also, the contact area between the storage node contact bodies and storage nodes can be maximized.

According to embodiments of the invention, since storage node contact bodies extend in a lengthwise direction of the bit lines, when storage nodes are arranged in a direction diagonal to the lengthwise direction of the bit lines or gate lines, sufficient contact areas between the storage node contact bodies and the storage nodes can be secured. Accordingly, in a plane view, the storage nodes can be newly arranged and formed in the shape of square cylinders. As a result, it is possible to secure a sufficient interval between the storage nodes and prevent collapse fails between the storage nodes.

An embodiment of the invention will be described below in more detail with reference to the appended drawings.

FIGS. 1A through 8A, 1B through 8B, and 9A through 9C are schematic cross-sectional views illustrating a method of manufacturing a semiconductor device that includes a contact body extending in the direction of a bit line to contact a storage node, according to an embodiment of the invention.

Figure 1B:
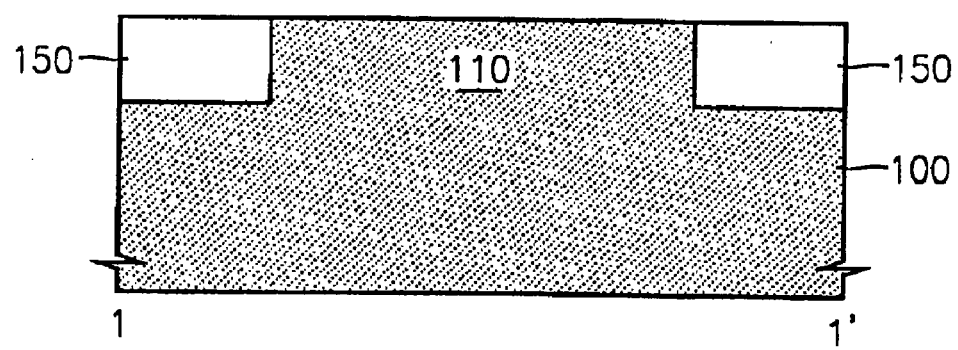
FIGS. 1B, 2B, 3B, 4B, 5B, 6B, 7B, 8B, and 9B are cross-sectional views taken along the lines 1-1', 2-2', 3-3', 4-4', 5-5', 6-6', 7-7', 8-8', and 9-9', respectively, of FIGS. 1A–9A.

FIG. 1A is a schematic top plan view illustrating the active regions 110 on a semiconductor substrate. FIG. 1B is a schematic cross-sectional view taken along line 1-1' of FIG. 1A.

Referring to FIGS. 1A and 1B, a device isolation region 150 is formed using a device isolation technique, such as trench isolation, in a semiconductor substrate 100 to define active regions 110. While the device isolation region 150 can define active regions 110 having a variety of shapes according to a device type, the active regions 110 are formed as a strait type as shown in FIG. 1A. The device isolation region 150 may be formed of an insulating material, such as silicon oxide, for filling trenches.

Thereafter, photolithographic and ion implantation processes for forming wells (not shown) and channels (not shown) of transistors may be performed on the semiconductor substrate 100.

Figure 2A:
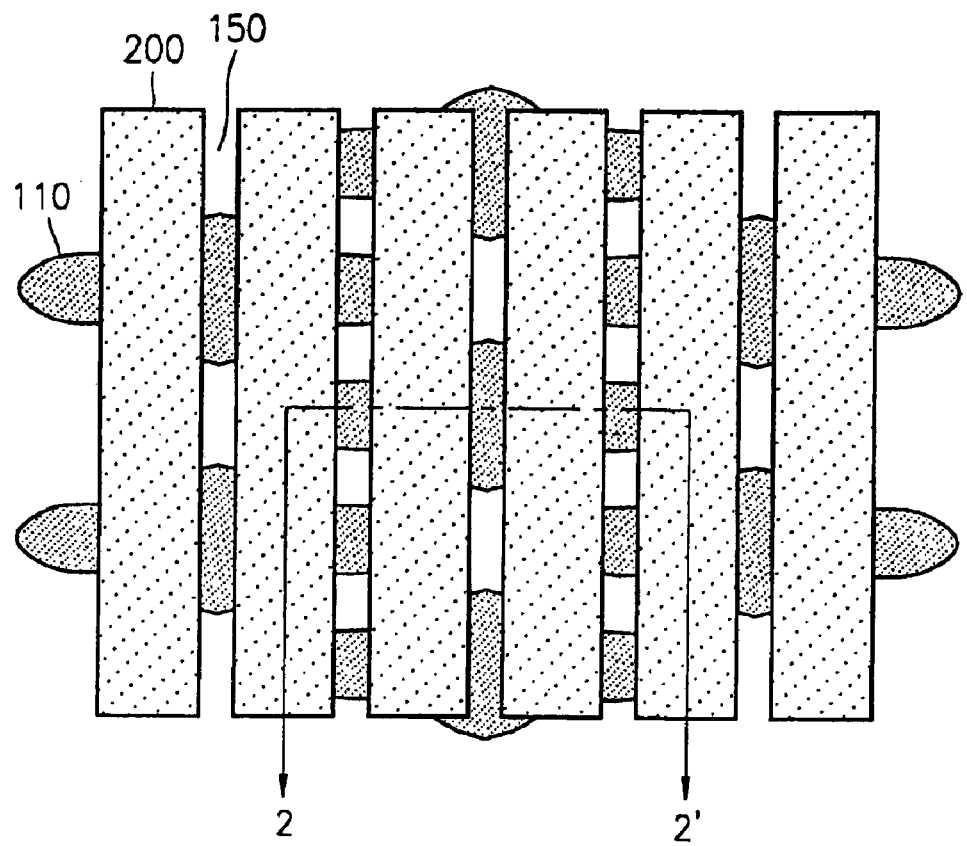
Figure 2B:
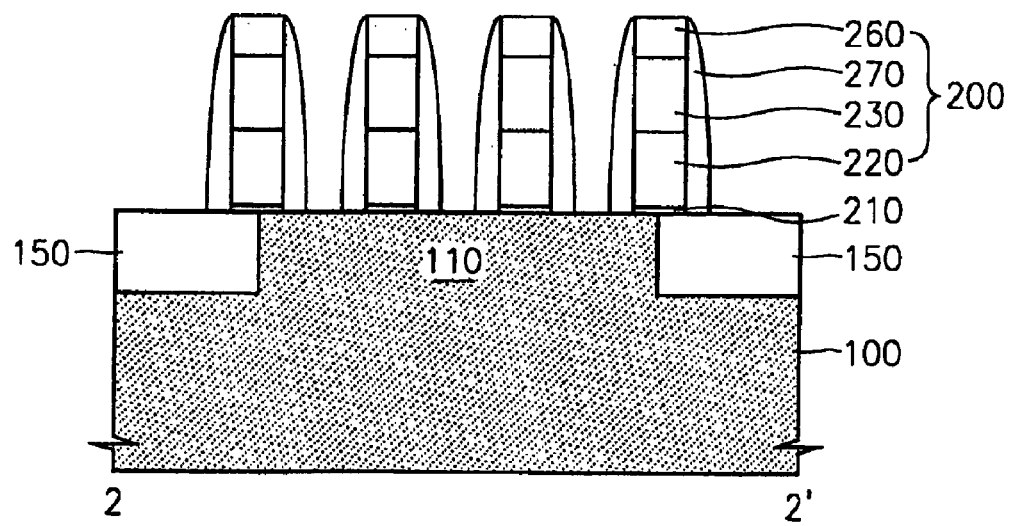

FIG. 2A is a schematic top plan view illustrating formation of gate lines 200 on the semiconductor substrate 100, and FIG. 2B is a schematic cross-sectional view taken along line 2-2' of FIG. 2A.

Referring to FIGS. 2A and 2B, a plurality of gate lines 200 are formed in the shape of lines to extend across the active region 110. Specifically, a pad oxide layer (not shown), which results from the ion implantation process and remains on the active region 110, is removed using wet etching, and then a thermal oxide layer (not shown) is grown over the active region 110 to form a gate oxide layer 210. The thickness of the gate oxide layer 210 may vary according to the characteristics of a device.

Next, gate layers 220 and 230 and a gate capping insulating layer 260 are sequentially formed on the gate oxide layer 210. The gate layers 220 and 230 may be formed of a conductive material. For example, a conductive doped polysilicon layer 220 is deposited to a thickness of about 1000 Å and a metal silicide layer is formed on the doped polysilicon layer 220 to improve the conductivity of the resulting gate layers 220 and 230. As the metal silicide layer, for example, a tungsten silicide layer 230 may be formed to a thickness of about 1000 Å. Then, a capping insulating layer 260 is formed on the tungsten silicide layer 230 to prevent damage to the gate layers 220 and 230 during a subsequent etching process. The capping insulating layer 260 is formed using silicon nitride to a thickness of about 2000 Å.

Afterwards, the capping insulating layer 260 and the gate layers 220 and 230 are sequentially patterned using photolithographic and etching processes. Thus, a plurality of gate lines 200 are formed to extend across the active region 110, as shown in FIG. 2A. Next, photolithographic and ion implantation processes are carried out in consideration of characteristics and regions of NMOS or PMOS transistors, thereby forming a lightly doped drain (LDD)-type region of a transistor.

Afterwards, an insulating layer is deposited to cover the insulating layers 200 and then etched, thereby forming gate spacers 270 on the sidewalls of the gate line 200. The gate spacers 270 may be formed using silicon nitride to prevent damage to the sidewalls of the gate lines 200.

Figure 3A:
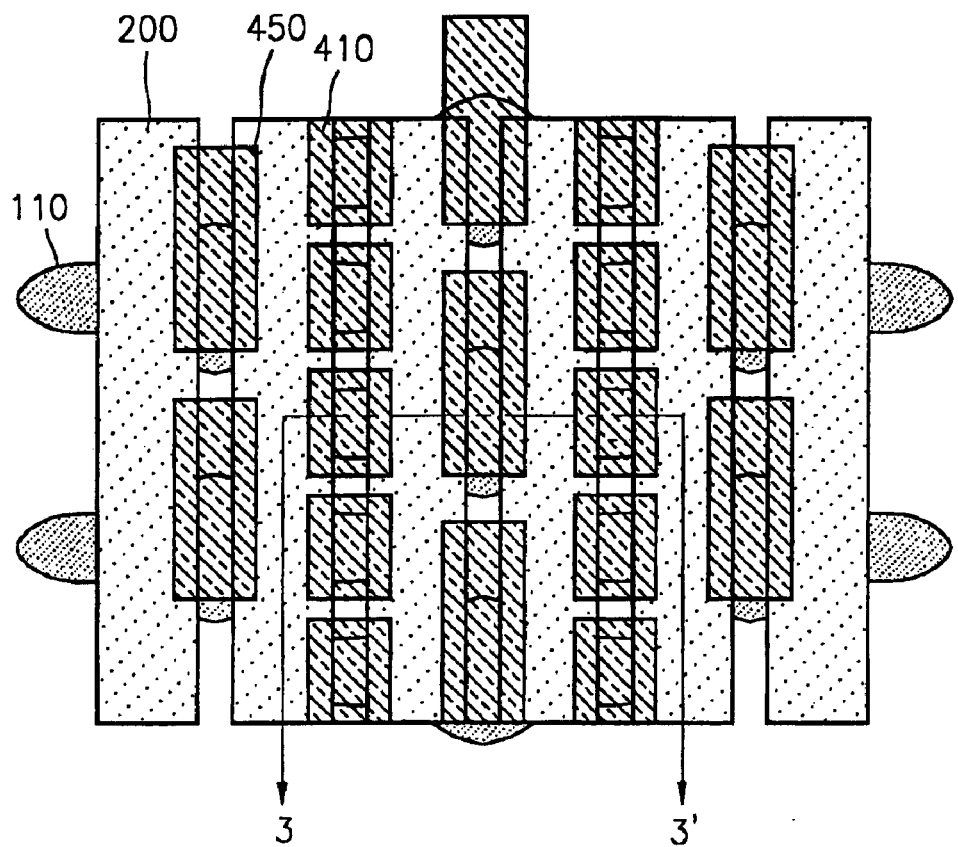
Figure 3B:
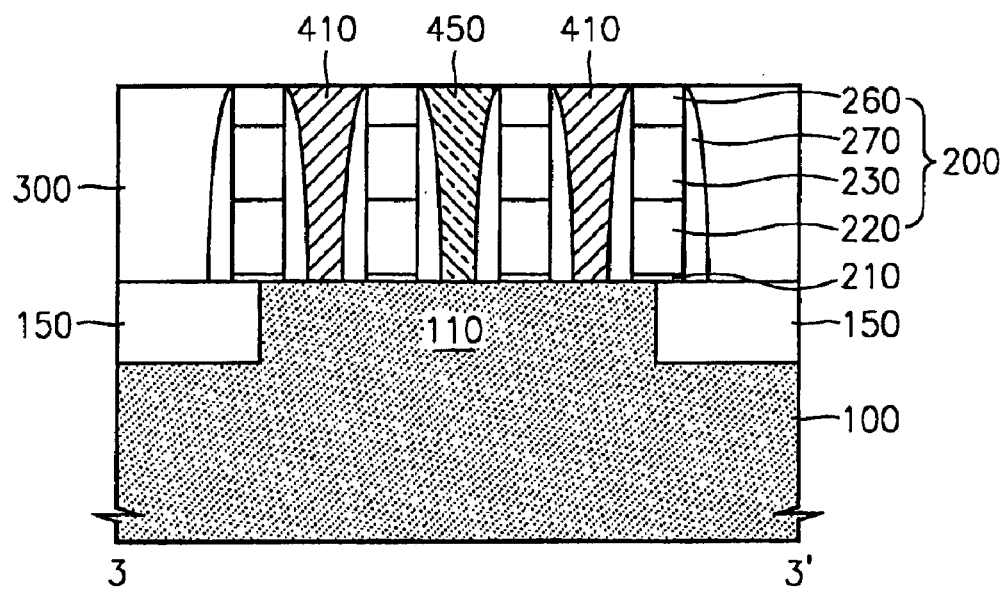

FIG. 3A is a schematic top plan view illustrating contact pads 410 and 450, and FIG. 3B is a schematic cross-sectional view taken along line 3-3' of FIG. 3A.

Referring to FIGS. 3A and 3B, a first insulating layer 300 is formed to fill a gap between the gate lines 200. The first insulating layer 300 may be formed of silicon oxide having a good gap filling characteristic, such as high-density plasma (HDP) oxide and borophosphorous silicate glass (BPSG). Next, the top surface of the first insulating layer 300 is planarized. The planarization process is preferably performed using chemical mechanical polishing (CMP).

Afterwards, a plurality of contact pads 410 and 450 are formed using a SAC process in the first insulating layer 300. The contact pads 410 and 450 can be classified into first contact pads 410, i.e., buried contact (BC) pads, for being electrically connected to the storage nodes and second contact pads 450, i.e., direct contact (DC) pads, for being electrically connected to the bit lines. The first contact pads 410 and the second contact pads 450, which are located between the gate lines 210, are spaced apart from each other.

For example, forming the contact pads 410 and 450 includes selectively removing a portion of the first insulating layer 300, where bit line contacts and storage node contacts will be formed, using photolithographic and selective etch processes until the active region 110 is exposed, thereby forming first contact holes. The first contact holes, which may be formed as a band type, can expose a plurality of portions where the contact pads 410 and 450 will be formed.

In other words, the first contact holes can expose two or more gate lines 200 extending across the gate lines 200 and expose a plurality of portions of the active regions 110 between the gate lines 200. The formation of the band-type first contact holes makes it possible to overcome exposure restrictions of the photolithographic process. Since the size of the first contact hole is larger than that of each of the contact pads 410 and 450, the process margin, which is required for exposing and developing a photoresist pattern (not shown) used for forming the first contact hole, can be increased.

Afterwards, impurity ions are implanted into the exposed portions of the active region 110 to aid in reducing the contact resistance between the active region 110 and the contact pads 410 and 450 that will be formed later. Next, a conductive material, such as a doped polysilicon containing n-type impurity ions, is deposited to a thickness of about 2500 Å to fill the first contact holes. Then, the conductive layer is etched using an etchback process or a CMP process until the top surface of the capping insulating layer 260 disposed on the gate lines 200 is exposed. Thus, the conductive layer is separated into respective contact pads 410 and 450.

Figure 4A:
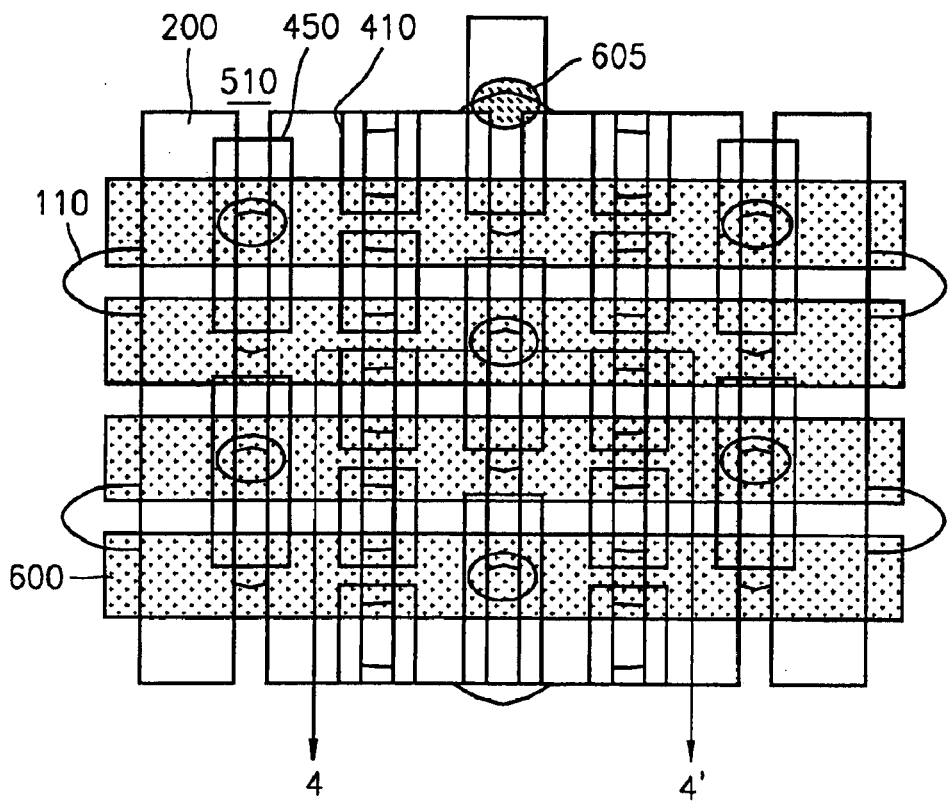
Figure 4B:
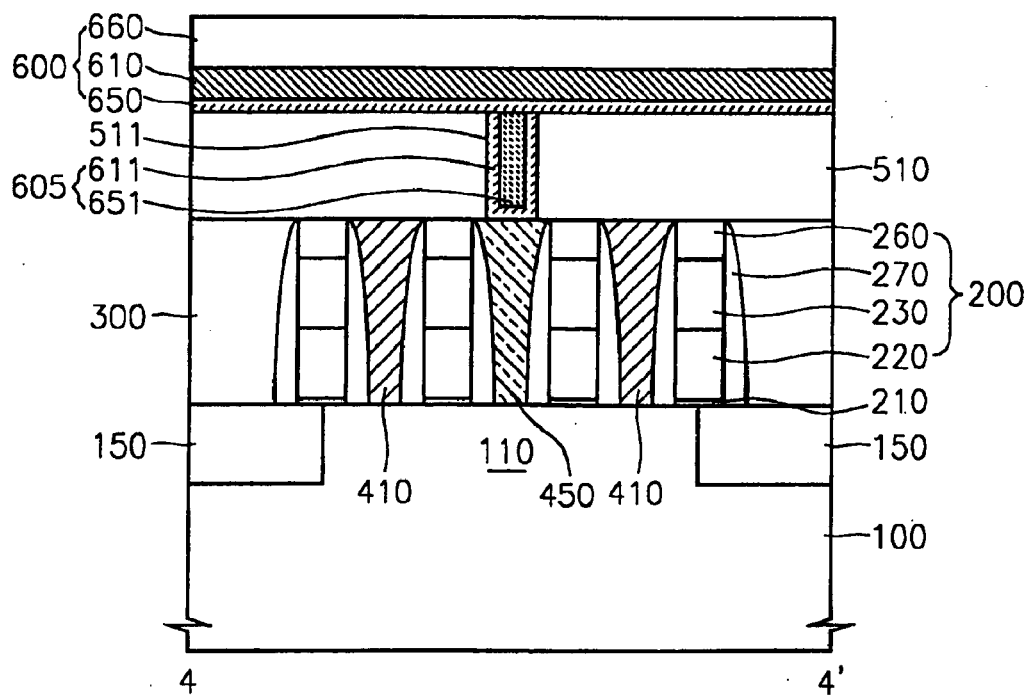

FIG. 4A is a schematic top plan view of the bit lines 600, and FIG. 4B is a schematic cross-sectional view taken along line 4-4' of FIG. 4A.

Referring to FIGS. 4A and 4B, a second insulating layer 510 is formed on the first insulating layer 300 to cover the contact pads 410 and 450. The second insulating layer 510 is formed to insulate the first contact pads 410, i.e., the BC pads, from the bit lines 600. The second insulating layer 510 is formed of an insulating material, such as silicon oxide.

Next, a second contact hole 511 is formed using photolithographic and etching processes by penetrating the second insulating layer 510 to selectively expose the top surface of the second contact pad 450, i.e., the DC pad. The second contact hole 511 is prepared to form a second contact, i.e., a DC. Next, the second contact hole 511 is filled with the second contact, i.e., the DC, to electrically connect the bit line 600 and the second contact pad 450. For example, a barrier metal layer 611 is deposited using titanium nitride (TiN) and a metal conductive layer 651 is deposited using tungsten (W). Then, the barrier metal layer 611 and the metal conductive layer 651 are planarized using an etchback process or CMP, thereby forming a second contact 605 filling the second contact hole 511.

Afterwards, a bit line 600 is formed using a known method to be electrically connected to the second contact 605. For example, to form the bit line 600, a barrier metal layer 610 and a metal conductive layer 650 are deposited using TiN and W, respectively, and then patterned. Here, the second contact 605, i.e., the DC, filling the second contact hole 511 is used to electrically connect the bit line 600 and the second contact pad 450.

A bit line capping insulating layer 660 is formed using silicon nitride on the bit line 600, while bit line spacers (not shown) are deposited on the sidewalls of the bit line 600. The capping insulating layer 660 and the spacers are formed to prevent damage to the bit line 600 during subsequent formation of storage node contact bodies, i.e., BCs.

Figure 5A:
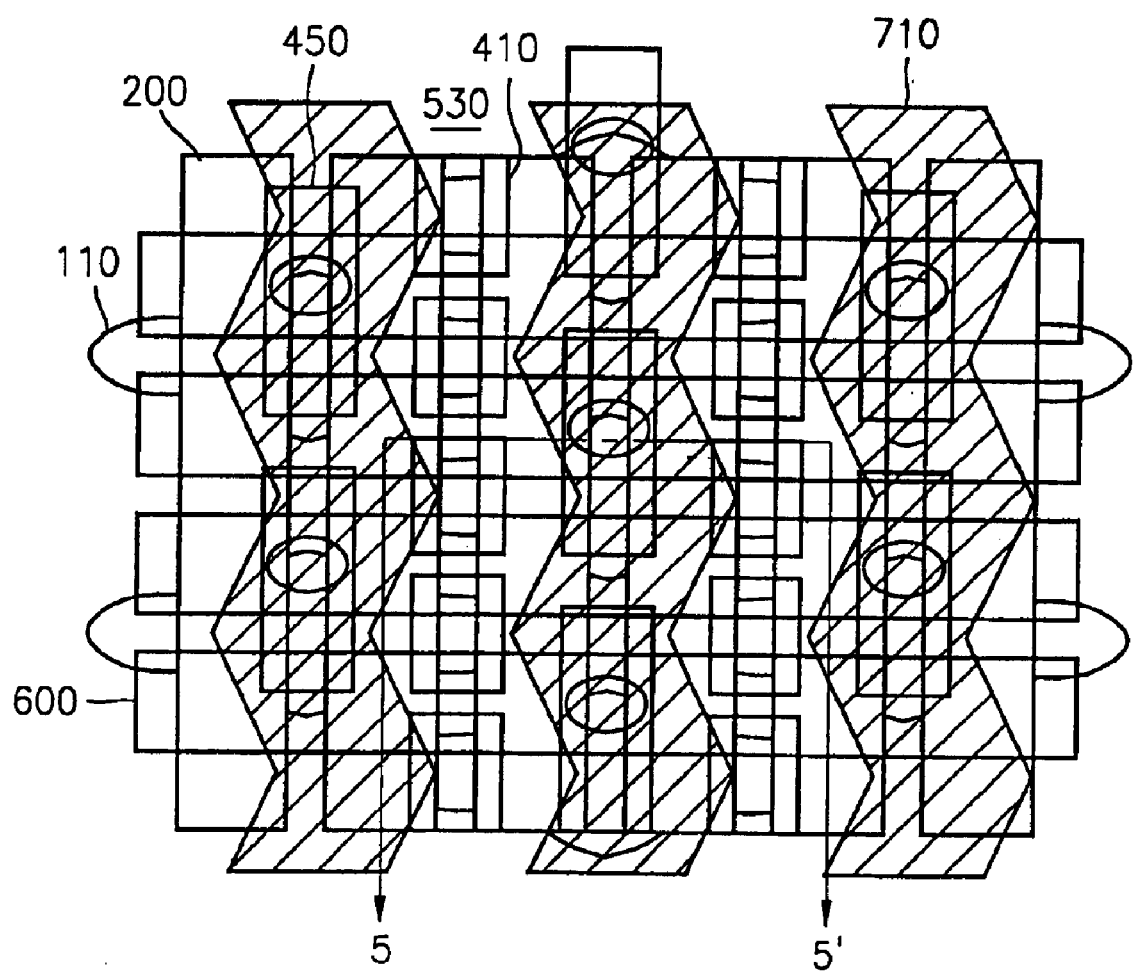
Figure 5B:
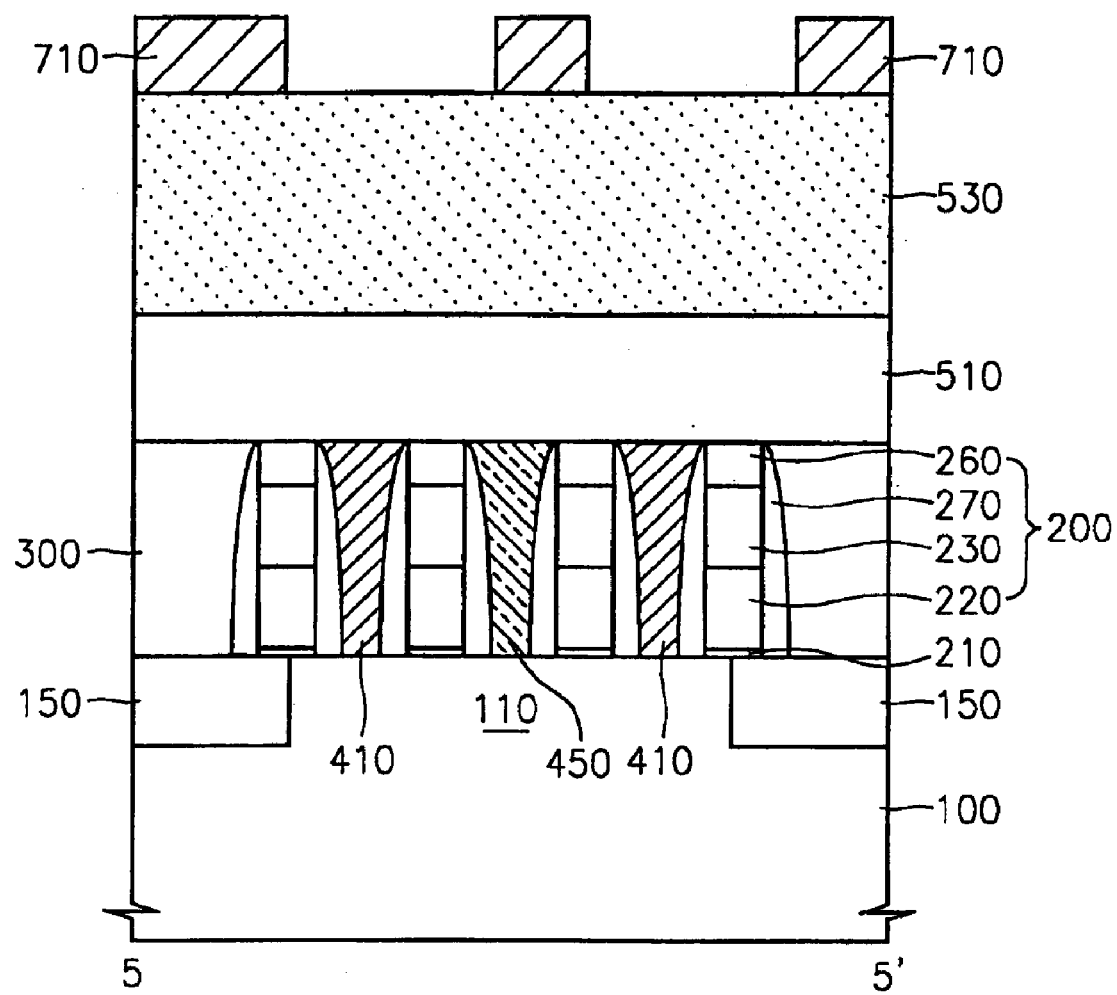

FIG. 5A is a schematic top plan view illustrating the formation of a band-type photoresist pattern on a third insulating layer 530 covering the bit line 600, and FIG. 5B is a schematic cross-sectional view taken along line 5-5' of FIG. 5A.

Referring to FIGS. 5A and 5B, the third insulating layer 530 is formed to cover the bit line 600. For example, the third insulating layer 530 is formed of silicon oxide having a good gap filling characteristic, such as HDP oxide and BPSG. Afterwards, the surface of the third insulating layer is selectively planarized. The planarization process may use a CMP process. A photoresist pattern 710 is formed on the third insulating layer 530. The photoresist pattern 710 is used to perform photolithographic and etching processes for forming an opening, which will be used to form a BC, i.e., a storage node contact body. The photoresist pattern 710 is formed as a band-type pattern on the third insulating layer 530 to expose a portion of the third insulating layer 530, which covers a plurality of first contact pads 410 disposed in rows.

Here, as seen in FIG. 5A, the photoresist pattern 710 is bent to have a convex sidewall in a lengthwise direction of the bit lines 600 at an overlapping portion of the exposed portion and a portion between the bit lines 600. Also, a portion opposite the convex sidewall of the exposed portion is concavely bent in the same direction. Also, the portion exposed by the photoresist pattern 710 is formed such that the portion adjacent to the convex sidewall and the portion adjacent to the concave sidewall are alternately disposed in a lengthwise direction of the gate line 200.

In other words, as shown in FIG. 5A, the photoresist pattern 710 has a zigzag band-type region. Here, the zigzag band-type region overlaps the portion between the bit lines 600. To form the exposed region in the shape of a zigzag band, the photoresist pattern 710 is also formed in the shape of the zigzag band.

The zigzag band-type photoresist pattern 710 leads to a large process margin in the photolithographic process for patterning the photoresist pattern 710. That is, it is possible to form the foregoing zigzag band-type photoresist pattern 710 using a photoresist process, of which resolution is lower than that of the photolithographic process for forming a contact hole exposing only the first contact pad 410. Thus, a sufficient process margin required for the photolithographic process can be secured.

The photoresist pattern 710 may be formed such that an exposed portion of the third insulating layer 530 covering the first contact pad 410 is wider than the width of the first contact pad 410. Thus, the photolithographic process for forming the photoresist pattern 710 can secure a larger resolution margin or process margin.

Figure 6A:
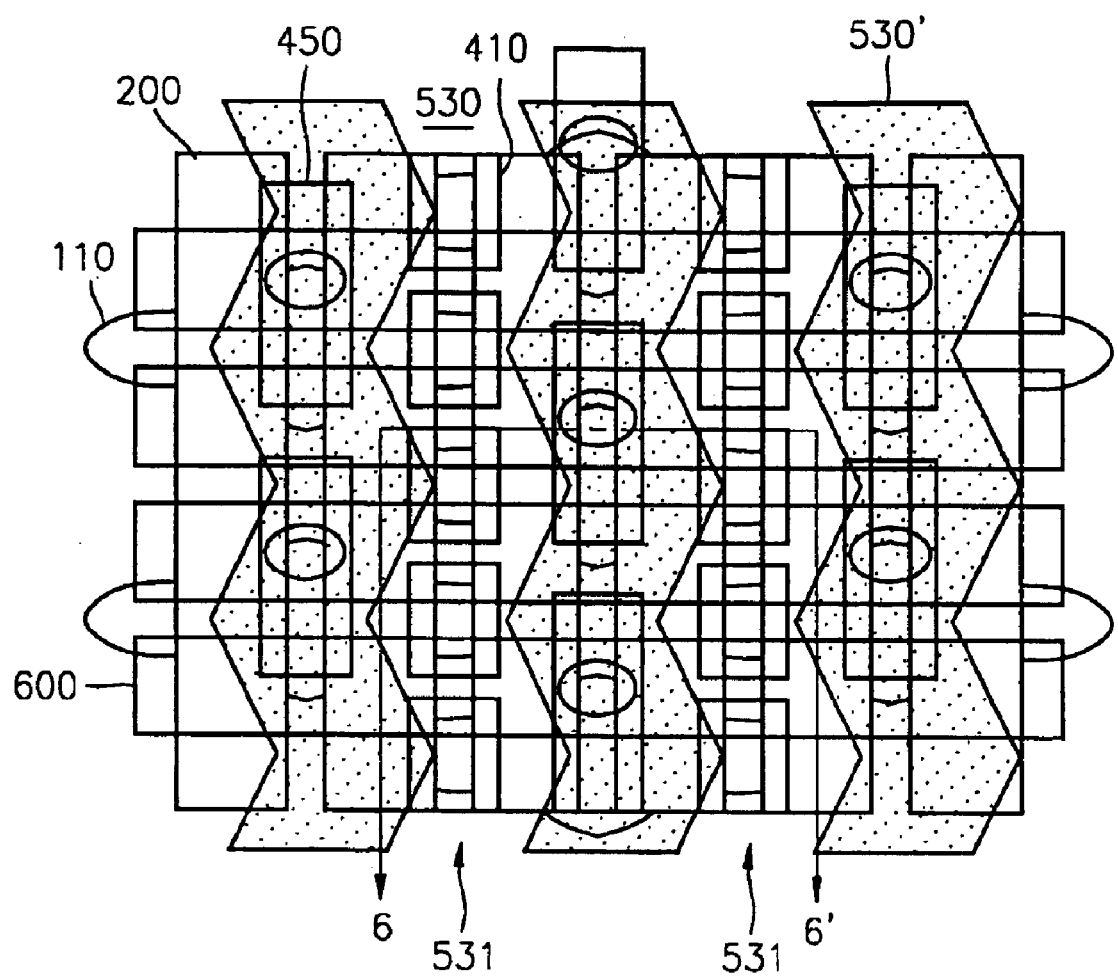
Figure 6B:
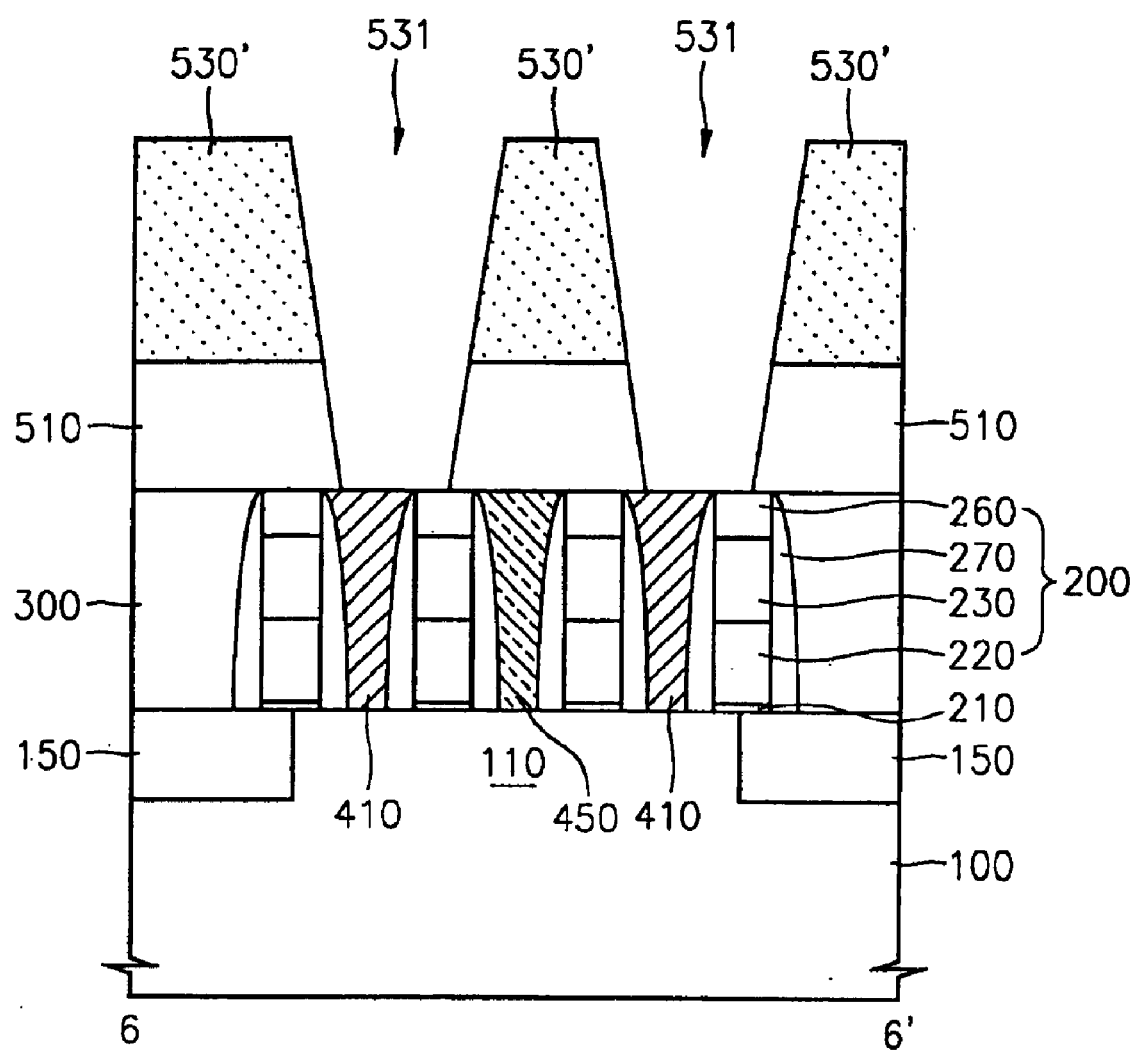

FIG. 6A is a schematic top plan view illustrating the formation of a zigzag band-type opening 531 exposing the plurality of first contact pads 410, and FIG. 6B is a schematic cross-sectional view taken along line 6-6' of FIG. 6A.

Referring to FIGS. 6A and 6B, the exposed portion of the third insulating layer 530 is selectively etched using the photoresist pattern (710 of FIG. 5A) as an etch mask, thereby forming a zigzag band-type opening 531. Here, if the third insulating layer 530 is formed of silicon oxide, a dry etch process may be used. The etch process is performed until the top surface of the first contact pads 410 are exposed.

The resulting zigzag band-type opening 531 is disposed along the gate line 200. Accordingly, as shown in FIG. 6A, the plurality of first contact pads 410 are exposed in rows in the portion exposed by the zigzag band-type opening 531. Also, the zigzag band-type opening 531 is formed across the bit lines 600 passing by the first contact pads 410. The sidewalls and the top surface of the bit lines 600, as shown in FIG. 4B, are protected by the bit line spacers and the bit line capping insulating layer 660, respectively. Since the bit line capping insulating layer 660 and the bit line spacers are formed of silicon nitride, the bit lines 600 can be protected by a high etch selectivity.

The width of the zigzag band-type opening 531 depends on the width of the portion exposed by the photoresist pattern 710. As shown in FIG. 6A, since the opening 531 protrudes in a lengthwise direction of the bit line 600, even if misalignment occurs, the top surface of the first contact pad 410 can be sufficiently exposed. Thus, the formation of the zigzag band-type opening 531 enables, for example, a larger overlay margin.

Also, the opening 531, which is bent alternately in a lengthwise direction of the bit line 600, extends toward the first contact pad 410, e.g., an upper portion of the gate line 200, as shown in FIG. 6B. That is, the opening 531 exposes a portion eccentric toward the upper portion of the gate line 200, i.e., in a lengthwise direction of the bit line 600. As shown in FIG. 5A, the zigzag band-type photoresist pattern 710 is bent alternately on both sides of the bit line 600.

Here, as shown in FIG. 5A, the region exposed by the photoresist pattern 710 may overlap or extend toward the second contact pad 450, which should not be exposed by the opening 531. Once the region exposed by the photoresist pattern 710 extends toward the upper portion of the second contact pad 450 or an adjacent portion thereof, a storage node contact body, i.e., a BC, which will fill the opening 531, can maximally be eccentric in a lengthwise direction of the bit line 600 to have the extended top surface.

If the storage node contact body has the most extended top surface, the contact area between the storage node contact body and the storage node can be maximized. Also, even if storage nodes are arranged in a diagonal direction to the lengthwise direction of the gate line 200, a sufficient contact area between the storage node and the storage node contact body can be secured.

The opening 531 is preferably etched using taper etching to maximally space the bottom of the opening 531 from the second contact pad 450, i.e., to prevent the opening 531 from exposing the second contact pad 450. That is, the sidewalls of the opening 531 are formed such that the bottom CD of the opening 531 is less than the upper CD. Even if the photoresist pattern 710 exposes the overlapping region between the photoresist pattern 710 and the second contact pad 450, the taper etching prevents the second contact pad 450 from being exposed by the opening 531.

Figure 7A:
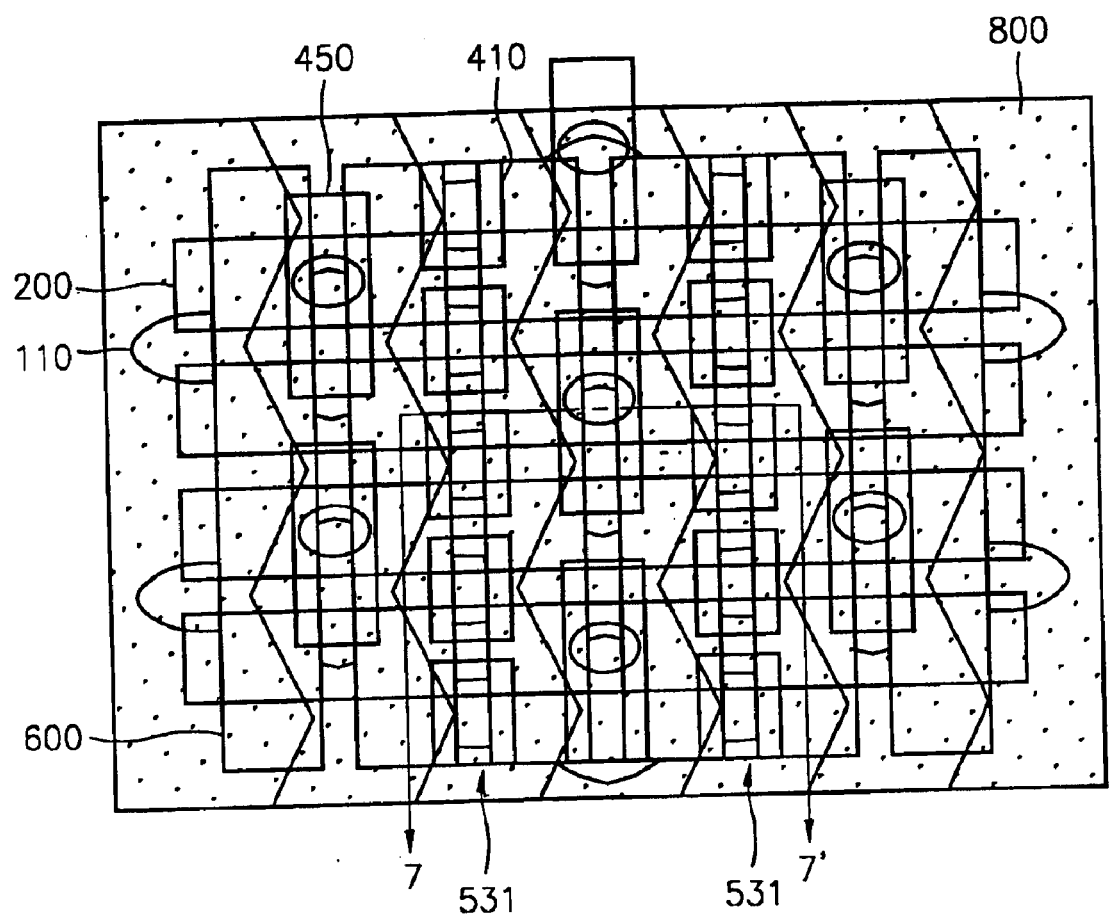

FIG. 7A is a schematic top plan view illustrating formation of a conductive layer 800 on a third insulating layer 530' to fill the zigzag band-type opening 531, and FIG. 5B is a schematic cross-sectional view taken along line 7-7' of FIG. 7A.

Figure 7B:
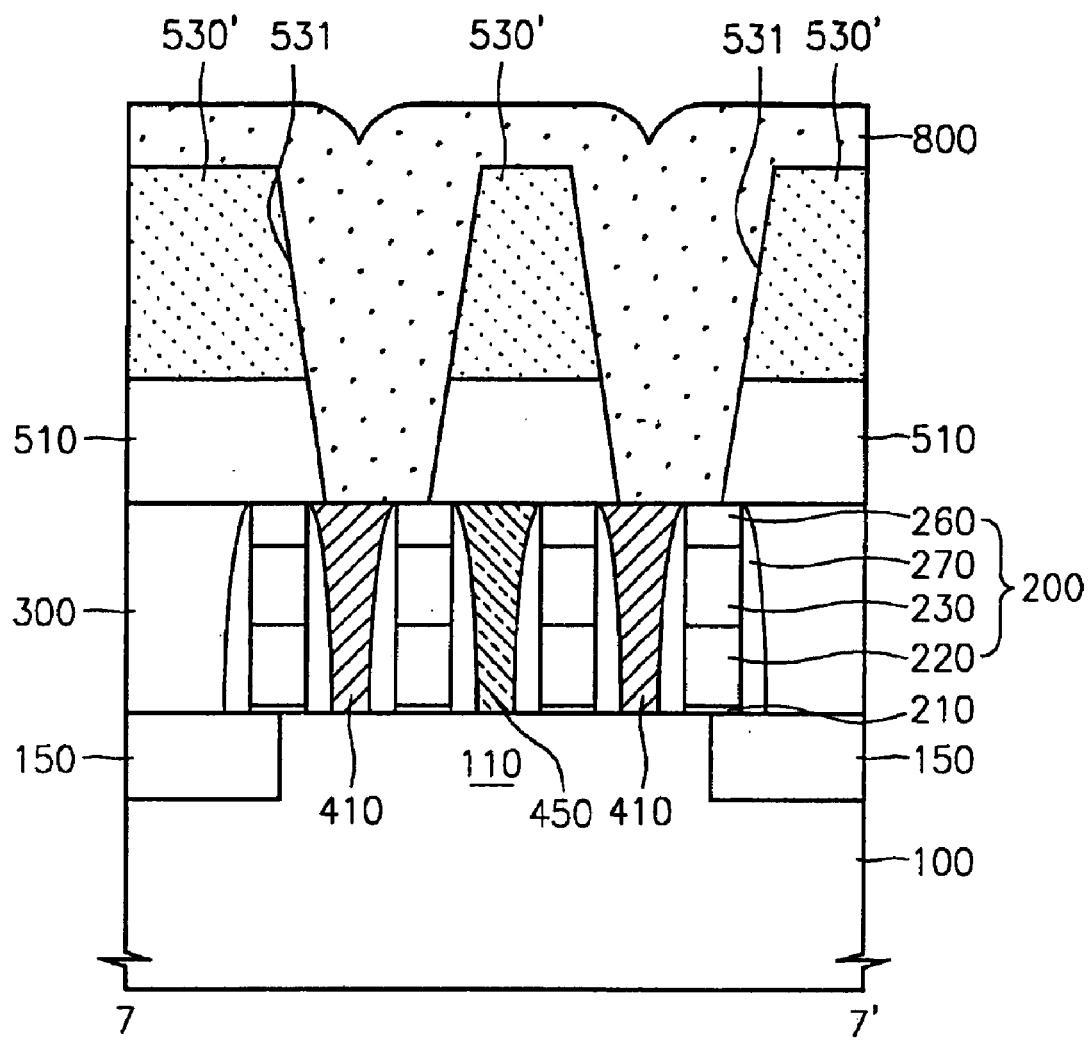

Referring to FIGS. 7A and 7B, the conductive layer 800, e.g., a conductive polysilicon layer, is formed on the patterned third insulating layer 530' to fill the zigzag band-type opening 531. The conductive polysilicon layer may be formed using chemical vapor deposition (CVD) to a thickness that is enough to fill the zigzag band-type opening 531. The conductive layer 800, or the conductive polysilicon layer, preferably extends to cover the top surface of the third insulating layer 530'. The conductive layer 800 covers the bit line 600, which is exposed by the zigzag band-type opening 531.

Figure 8A:
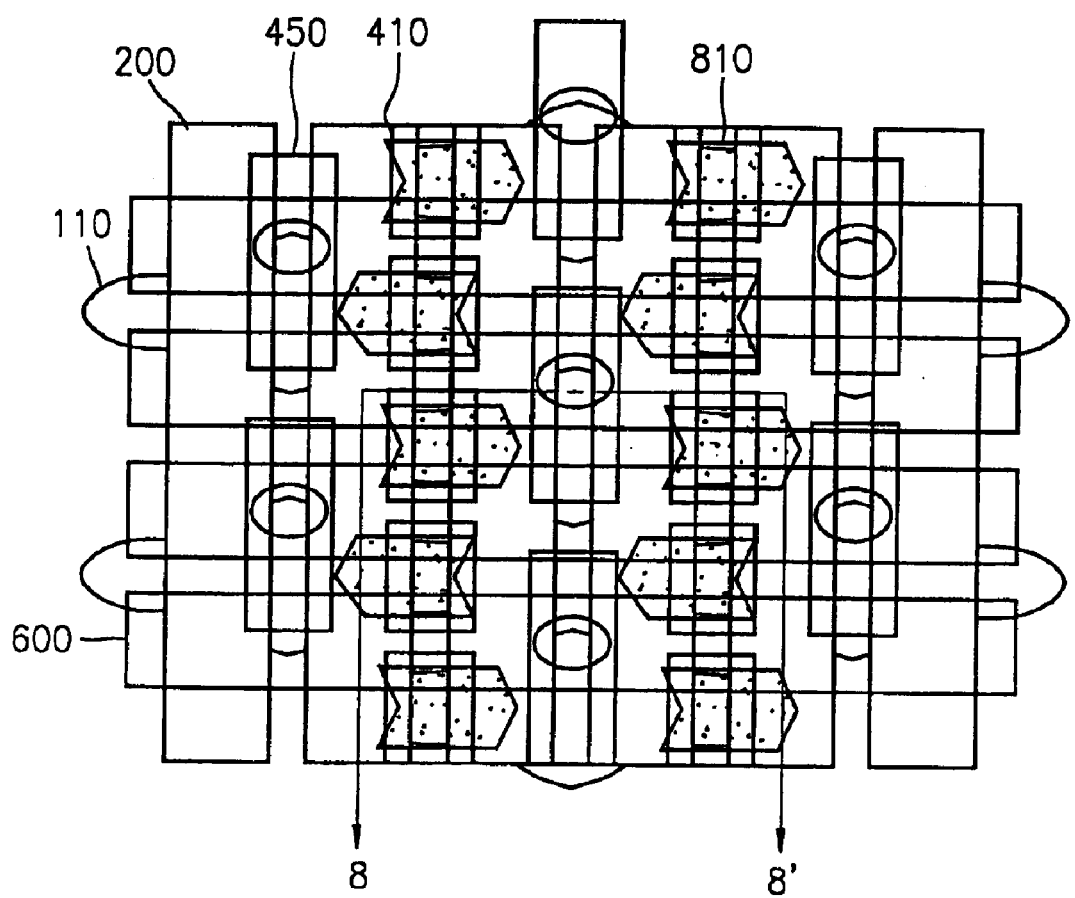
Figure 8B:
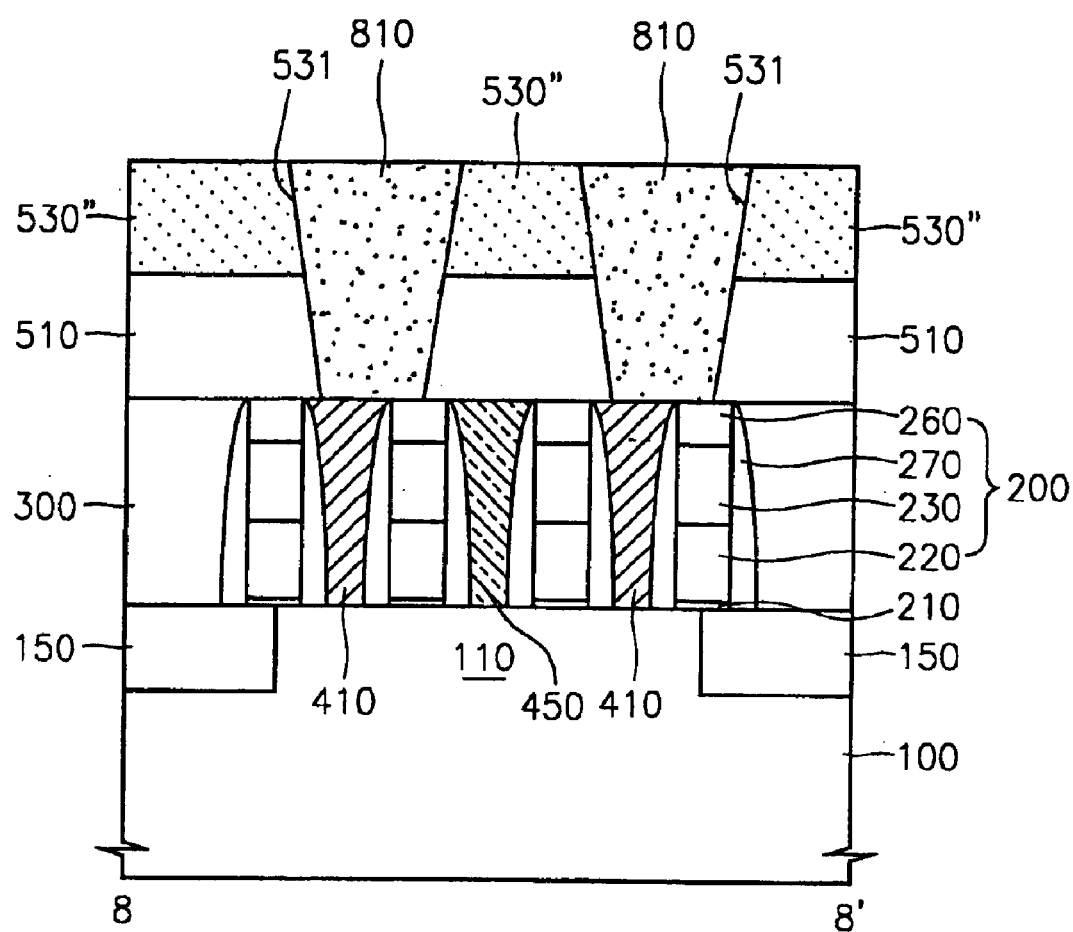

FIG. 8A is a schematic top plan view illustrating the separation of the conductive layer 800 into individual storage node contact bodies 810, and FIG. 8B is a schematic cross-sectional view taken along line 8-8' of FIG. 8B.

Referring to FIGS. 8A and 8B, the conductive layer 800 is planarized and separated into individual storage node contact bodies 810, i.e., BCs. The conductive layer is planarized using an etch process or a CMP process. Here, the planarization process is performed until the top surface of the bit line capping insulating layer (660 of FIG. 4B) is sufficiently exposed. Thus, the conductive layer 800 is separated into the individual storage node contact bodies 810.

After the planarization process is carried out until the bit line capping insulating layer 660 is exposed, the separation of the storage node contact bodies 810 is completed in a lengthwise direction of the gate line 200. During the planarization process, the third insulating layer 530" is also planarized, thus reducing its thickness. Since the bit line capping insulating layer 660 is formed of silicon nitride, the third insulating layer 530" of silicon oxide may have an etch selectivity with respect to the bit line capping insulating layer 660 and may be planarized. Thus, the bit line capping insulating layer 660 functions as an etch stop point or a polishing stop point during the planarization process.

The resulting storage node contact bodies 810 will electrically connect storage nodes that are formed at a later time and the first contact pads 410. According to embodiments of the invention, storage nodes are arranged to be zigzag in a lengthwise direction of the bit line 600. In other words, the storage nodes are diagonally offset from each other along the bit line 600. The storage nodes partially overlap the bit line 600. Also, the storage nodes are arranged to be zigzag in a lengthwise direction of the gate line 200, i.e., the word line. That is, the storage nodes are diagonally offset from each other along the gate line 200. The storage nodes partially overlap the gate line 200.

However, when the storage nodes are arranged in diagonal directions from the bit line 600 and the gate line 200, the center of the storage node is not aligned with the center of the first contact pad 410. Thus, to permit the storage node contact body 810 to electrically connect the storage node and the first contact pad 410, the storage node contact body 810 preferably has a top surface that extends in a lengthwise direction of the bit line 600.

As shown in FIGS. 7A and 7B, the storage node contact body 810 filling the zigzag band-type opening 531 is formed after the zigzag band-type opening 531 extends in a lengthwise direction of the bit line 600. Thus, the zigzag band-type opening 531 has a sufficient-extended shape in a lengthwise direction of the bit line 600.

Referring again to FIGS. 6A and 8A, the zigzag band-type opening 531 has a protruding shape in a lengthwise direction of the bit line 600. Although the protruding extent is slightly illustrated in FIG. 6A, as long as the second contact pad 450 adjacent to the bottom of the opening 351 is not exposed, the opening 531 may extend to overlap the region of top surface of the second contact pad 450. That is, since the opening 531 is formed using taper etching to have oblique sidewalls, the bottom of the storage node contact body 810 filling the opening 531 may be narrower than the top surface thereof. Therefore, the top surface of the storage node contact body 810 may extend to overlap the top surface of the second contact pad 450.

To permit the storage node contact body 810 to extend to overlap the top surface of the second contact pad 450, as shown in FIG. 6A, the opening 531 is preferably formed in the shape of a more seriously bent zigzag band. When the photoresist pattern (710 of FIG. 5A) used for the opening 531 is bent at a more acute angle than that shown in FIG. 5A, the opening 531 may extend more in a lengthwise direction of the bit line 600. Then, the top surface of the storage node contact body 810 filling the opening 531 may extend more in a lengthwise direction of the bit line 600.

Even if the upper width of the opening 531 excessively extends in a lengthwise direction of the bit line 600, the tapered etching makes it possible to prevent the opening 531 from exposing the second contact pad 450.

Referring again to FIG. 8A, the individual storage node contact bodies 810 extend in a lengthwise direction of the gate line 200 and in a direction opposite to adjacent storage node contact bodies 810. To enable this arrangement, the opening 351 is formed in the shape of a zigzag band such that a bent point of the zigzag band is positioned between the bit lines 600.

Figure 9A:
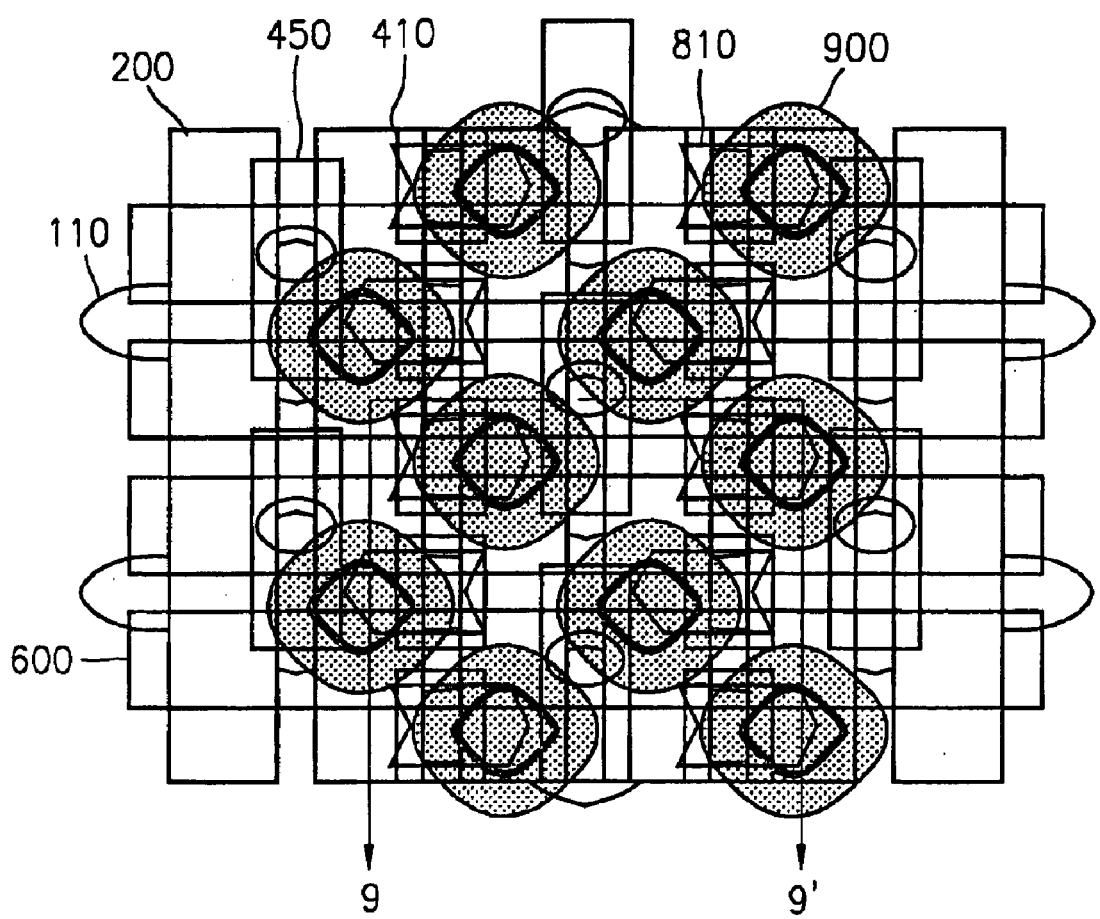
Figure 9B:
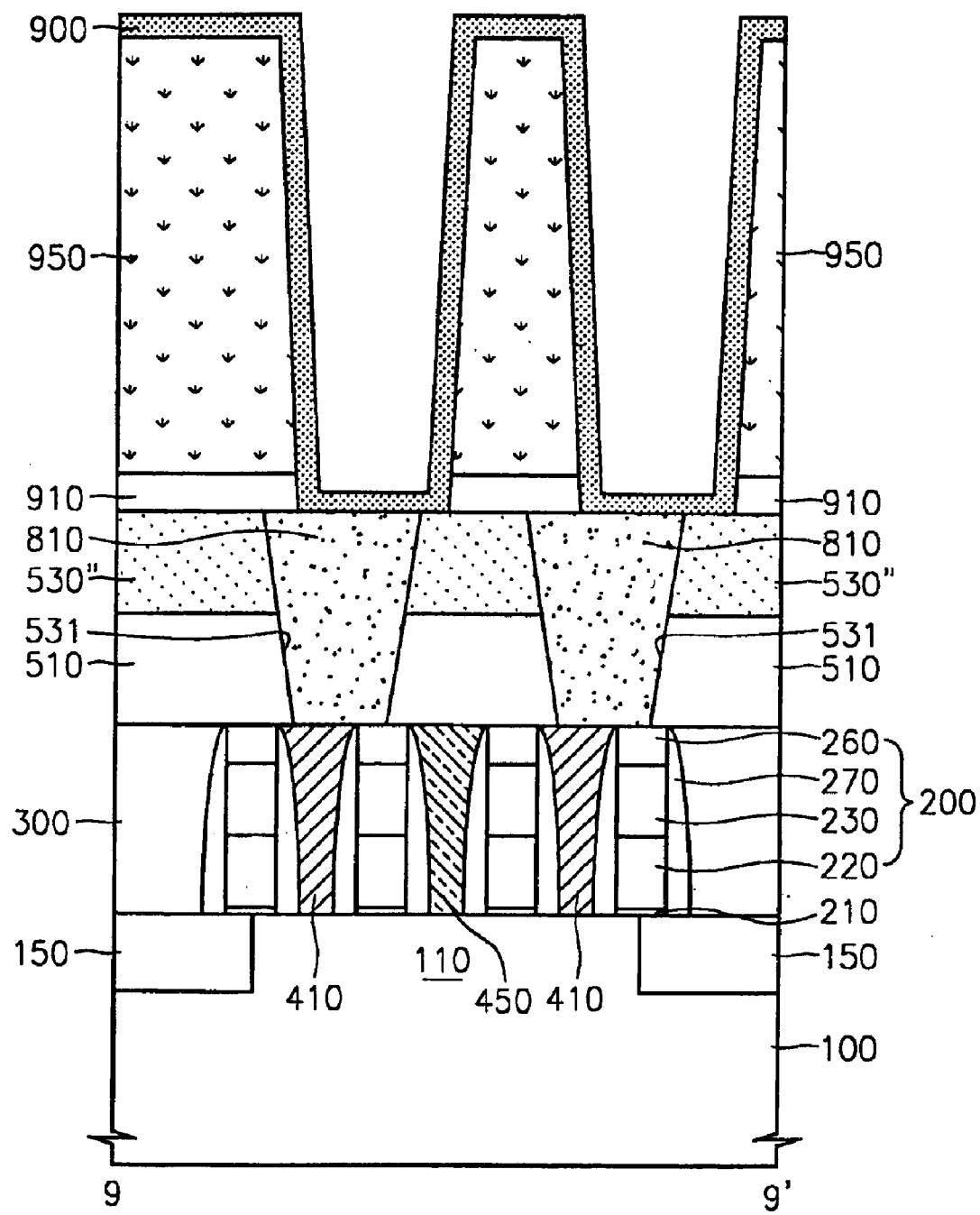
Figure 9C:
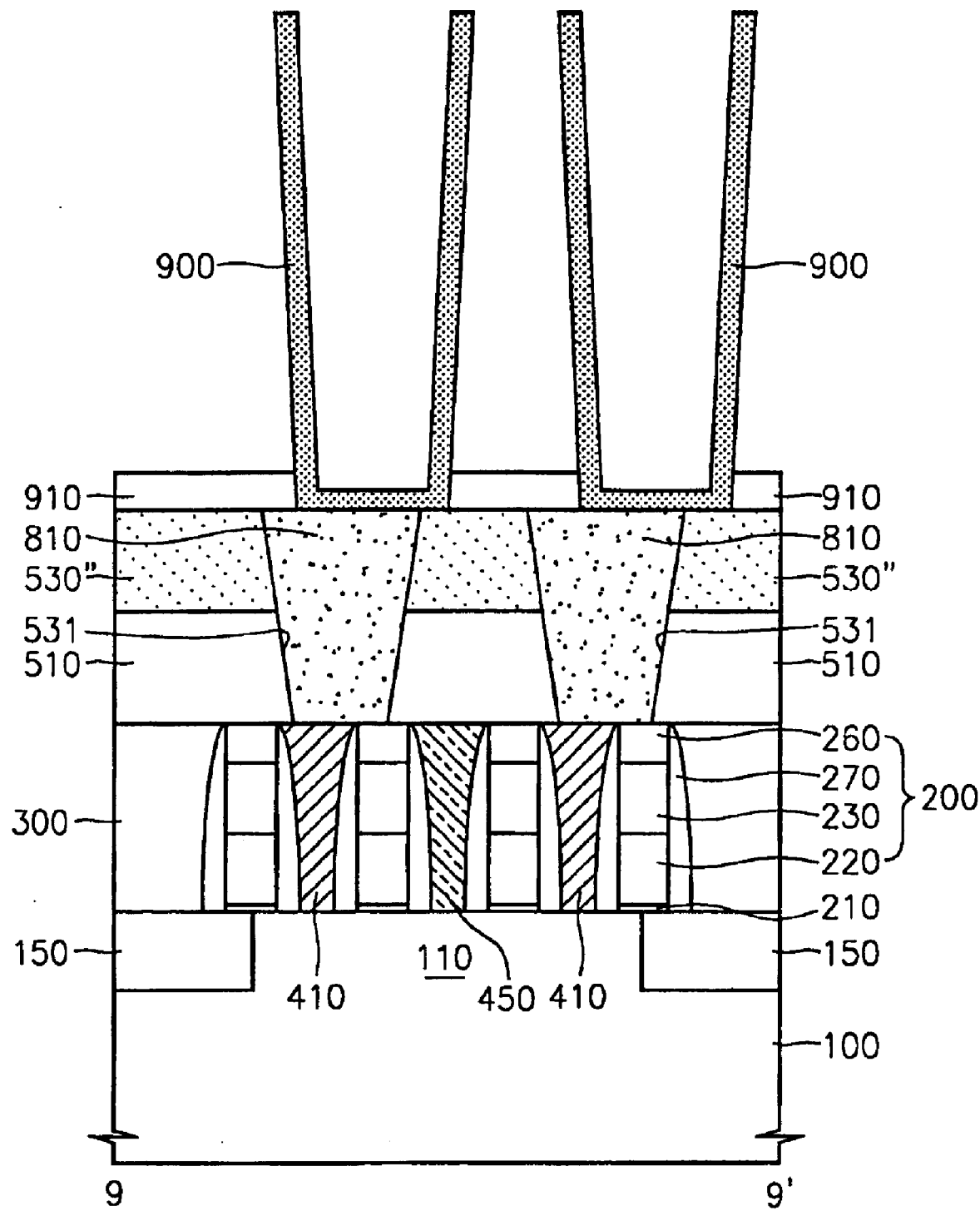
FIG. 9C is a cross-sectional view taken along the line 9-9' of FIG. 9A.

FIG. 9A is a schematic top plan view illustrating the formation of storage nodes 900, and FIGS. 9B and 9C are schematic cross-sectional views taken along line 9-9' of FIG. 9A.

Referring to FIGS. 9A, 9B, and 9C, the storage node 900 is formed in the shape of a cylinder that is electrically connected to the storage node contact body 810. Here, the storage node 900 may have a circular or square sectional shape. Even if a square storage node 900 is originally designed, the resulting storage node 900 may be formed in the shape of a square having rounded corners.

As shown in FIG. 9A, the storage nodes 900 are arranged in a direction diagonal to the bit line 600 or the gate line 200. Thus, the storage nodes 900 are arranged to be zigzag in the direction of the bit line 600 and in the direction of the gate line 200.

Since the storage nodes 900 are arranged as described above, a sufficient interval between the storage nodes 900 can be secured. Accordingly, when one cylindrical storage node (OCS) capacitor is formed, the collapse or 2-bit fail of the storage nodes can be effectively prevented.

The storage nodes 900 sufficiently overlap the storage node contact bodies 810. As described above, since the storage node contact bodies 810 sufficiently extend in a lengthwise direction of the bit line 600, contact areas between the storage node contact bodies 810 and the storage nodes 900 can be sufficiently secured. Although the center of the storage node 900 is substantially deviated, i.e., substantially offset from the center of the first contact pad 410, the storage node contact body 810 of the present embodiment can have a large extended top surface in a lengthwise direction of the bit line 600. Thus, it is possible to secure a sufficient contact area between the storage node contact body 810 and the storage node 900.

To form 3-dimensional or cylindrical storage nodes, as shown in FIG. 9B, a mold 950 may be formed as a sacrificial insulating layer. Specifically, a mold layer is formed on the storage node contact body 810 and the third insulating layer 530" to a thickness of about 1500 nm.

Here, an additional fourth insulating layer 910 may be formed as a buffer layer below the mold layer. The fourth insulating layer 910 may include a silicon nitride layer, which will be used as an etch stop layer when a silicon oxide layer for a node support layer and the mold layer are later removed. The silicon nitride layer for the etch stop layer may be formed to a thickness of about 500 Å. The node support layer may be selectively omitted. The node support layer is preferably formed to a thickness that is sufficient enough to cover the storage node contact body 810, i.e., to a thickness of about 100 Å to 1000 Å.

The mold layer formed on the fourth insulating layer 910, which will be removed after the storage node 900 is formed, is preferably formed of a removable insulating layer. For example, the mold layer 950 may be formed of PE-TEOS.

After the mold layer is deposited, a portion where the storage node 900 will be formed is selectively removed using photolithographic and etching processes. Thus, the mold layer is patterned until the top surface of the storage node contact body 810 is exposed, thereby forming the mold 950. The etching process for forming the mold 950 may be completed on the etch stop layer, i.e., the silicon nitride layer.

Afterwards, a conductive layer 901 is formed on the mold 950 and extends to cover the top surface of the exposed storage node contact body 810. The conductive layer 901 may be formed using conductive polysilicon to a thickness of about 400 Å to 500 Å. In a metal-insulator-metal (MIM) capacitor, the conductive layer 901 may be formed of a metal layer used as an electrode of the MIM capacitor.

A sacrificial insulating layer (not shown) is deposited on the conductive layer 901 to a thickness of about 3000 Å to 6000 Å and then planarized using dry etching or CMP to separate the conductive layer into individual storage nodes 900 as shown in FIG. 9C. To obtain tight separation, the planarization process is performed until the top surface of the mold 950 is exposed. That is, the planarization process is carried out until the sacrificial insulating layer is removed by about 1000 Å to 2000 Å. Next, the sacrificial insulating layer and the mold 950 are selectively removed using a wet etch process having a high etch selectivity with respect to polysilicon and silicon oxides. Thus, a cylindrical storage node 900 as shown in FIG. 9C is formed.

As described above, according to the present invention, misalignment can be prevented between contact pads and storage nodes, which are disposed to be zigzag in the direction of the bit lines or gate lines. Thus, storage node contact bodies can be formed such that reliable electrical connection between the storage nodes and the contact pads is secured.

In one plane, when storage nodes are arranged to be zigzag in the direction of the bit lines or gate lines, the collapse of the storage nodes can be effectively prevented. However, the center of the storage node is offset from the center of a contact pad connected to an active region of a semiconductor substrate. According to embodiments of the invention, since storage node contact bodies extend in a lengthwise direction of the bit lines by using zigzag band-type openings, the storage node can be electrically connected to the contact pad.

Also, according to embodiments of the invention, after the zigzag band-type opening is formed and a conductive layer is formed to fill the opening, the conductive layer is separated into individual storage node contact bodies using a SAC process. As a result, a sufficient process margin can be secured during photolithographic and etching processes for forming storage node contact bodies. Furthermore, additional sacrificial layers or conductive layers are not required, thus obtaining process simplification and mass production.

Also, storage node contact bodies can sufficiently extend in a lengthwise direction of bit lines. Thus, even though the centers of the storage nodes are not aligned with those of the BC pads, the storage nodes can be disposed in one plane. That is, the storage nodes are arranged in a direction diagonal to the lengthwise direction of the bit lines or gate lines. As a result, a sufficient interval between the storage nodes can be secured, preventing a bridge phenomenon between cylindrical storage nodes.

The words "concave" and "convex" are sometimes strictly used to describe curved surfaces. In the embodiment described above, however, the words "concave" and "convex" were used to describe band-type openings 531 that have a substantially zig-zag shape. Thus, "concave" and "convex", as used in this disclosure, should be given their broader meaning of "protruding inward" and "protruding outward", respectively. This meaning contemplates embodiments that have band-type openings 531 with straight line edges, but also embodiments with serpentine band-type openings that have curved edges. Thus, alternate embodiments of the invention may have band-type openings that are wavy, rather than zigzag, in appearance.

Embodiments of the invention will now be described in a non-limiting way.

In accordance with an aspect of the invention, there is provided a method of manufacturing a semiconductor device with contact bodies extending in the direction of bit lines. The method includes forming gate lines on a semiconductor substrate; forming a first insulating layer to cover the gate lines; forming first contact pads and second contact pads, which are electrically connected to the surface of the semiconductor substrate positioned between the gate lines by penetrating the first insulating layer. The method also includes forming a second insulating layer to cover the first contact pads and the second contact pads; forming bit lines on the second insulating layer to extend across the gate lines and to each be electrically connected to the second contact pads by penetrating the second insulating layer; forming a third insulating layer to cover the bit lines; forming band-type openings by selectively etching the third insulating layer, wherein the band-type openings extend in a lengthwise direction of the gate lines so as to expose the first contact pads and have portions that protrude in a lengthwise direction of the bit lines. The method further includes forming a conductive layer on the third insulating layer, wherein the conductive layer fills the openings and is electrically connected to the first contact pads; patterning the conductive layer to separate the conductive layer into individual storage node contact bodies, which extend in a lengthwise direction of the bit lines by filling the protruding portions of the openings; and forming storage nodes on the storage node contact bodies.

In another embodiment, the method of manufacturing a semiconductor device includes forming gate lines on a semiconductor substrate; forming a first insulating layer to cover the gate lines; and forming first contact pads and second contact pads that are electrically connected to the surface of the semiconductor substrate positioned between the gate lines by penetrating the first insulating layer. The method also includes forming a second insulating layer to cover the first contact pads and the second contact pads; forming bit lines on the second insulating layer, wherein the bit lines extend across the gate lines and are each electrically connected to the second contact pads through the second insulating layer; forming a third insulating layer to cover the bit lines; forming zigzag band-type openings by selectively etching the third insulating layer, wherein the band-type openings extend in a lengthwise direction of the gate lines so as to expose the first contact pads and have portions which protrude in a lengthwise direction of the bit lines as well as concave portions facing the protruding portions. The method further includes forming a conductive layer on the third insulating layer, wherein the conductive layer fills the band-type openings and is electrically connected to the first contact pads; patterning the conductive layer to separate the conductive layer into individual storage node contact bodies, which extend in a lengthwise direction of the bit lines by filling the protruding portions of the openings; and forming storage nodes on the storage node contact bodies.

The protruding portions of the openings are positioned between the bit lines, and the adjacent protruding portions, between which each bit line is positioned, are disposed in a direction opposite to each other.

Also, the zigzag portions of the openings are positioned between the bit lines, and the adjacent zigzag portions, between which each bit line is positioned, are alternately disposed in a direction opposite to each other.

The opening, of which the bottom has a line width that is less than that of an upper portion, may have oblique sidewalls.

Here, the openings may extend such that upper interfaces of the openings overlap upper portions of the gate lines, which are adjacent to the openings, at the protruding portions or the zigzag portions of the openings. Alternatively, the openings may extend such that upper interfaces of the openings partially overlap upper portions of the second contact pads, between which each gate line is positioned and which are adjacent to the openings, at the protruding portions or the zigzag portions of the openings. The openings may be performed using taper etching so that the sidewalls of the openings are oblique.

The openings may be formed to extend across and expose the bit lines. To prevent damage to the bit lines due to an etching process for forming the openings, the method may further include forming a capping insulating layer to cover the bit line and forming spacers to cover the sidewalls of the bit lines. Patterning the conductive layer may include planarizing the conductive layer until the upper surface of the capping insulating layer is exposed.

The storage nodes, between which the bit lines are positioned, may be arranged in a direction diagonal to the lengthwise direction of the bit line. Also, the storage nodes may be formed in the shape of cylinders having circular or rectangular areas. The method may further include forming a buffer layer to cover lower sides of the cylindrical storage nodes.

According to embodiments of the invention, a method of manufacturing a semiconductor device with contact bodies extending in the direction of bit lines is provided to secure reliable electrical connection between active regions and storage nodes. In this method, the storage nodes can be positioned to be zigzag with active regions disposed on a semiconductor device. As a result, collapse of the cylindrical storage nodes can be effectively prevented.

While the invention has been particularly shown and described with reference to preferred embodiments thereof, it will be understood by those of ordinary skill in the art that various changes in form and details may be made therein without departing from the spirit and scope of the invention as defined by the following claims.

What is claimed is:

1. A method of manufacturing a semiconductor, the method comprising:

forming gate lines on a semiconductor substrate;

forming a first insulating layer between the gate lines;

forming first contact pads and second contact pads in the first insulating layer and between the gate lines, the first and second contact pads a surface of the semiconductor substrate;

forming a second insulating layer overlying the first and second contact pads;

forming bit lines on the second insulating layer, the bit lines electrically connected to the second contact pads and extending across the gate lines;

forming a third insulating layer overlying the bit lines; and forming band-type openings by selectively etching a portion of the third insulating layer, wherein the band-type openings extend in a lengthwise direction of the gate lines to expose the first contact pads, and wherein the band-type openings have portions that protrude in a lengthwise direction of the bit lines.

2. The method of claim 1, further comprising:

forming a conductive layer on the third insulating layer, wherein the conductive layer fills the band-type openings and is electrically connected to the first contact pads;

separating the conductive layer into individual storage node contact bodies; and forming storage nodes on the storage node contact bodies.

3. The method of claim 1, wherein the protruding portions are positioned between the bit lines.

4. The method of claim 3, wherein the protruding portions comprise a triangular with vertices disposed between the bit lines.

5. The method of claim 1, wherein the protruding portions comprise adjacent protruding portions protrude in opposite directions and each bit lines is positioned between the adjacent protruding portions.

6. The method of claim 1, wherein the openings has a bottom portion with a line width less than a line width of an upper portion of the openings so as to have oblique sidewalls.

7. The method of claim 6, wherein the upper portion of the openings overlaps an upper portion of the gate lines at the protruding portions.

8. The method of claim 6, wherein the upper portion of the openings partially overlaps an upper portion of the second contact pads at the protruding portions.

9. The method of claim 6, wherein forming band-type openings comprises taper etching to make the sidewalls of the openings oblique.

10. The method of claim 1, wherein forming band-type openings comprises forming band-type openings that extend across and expose the bit lines.

11. The method of claim 1, further comprising:

forming a capping insulating layer overlying the bit lines; and forming spacers to cover the sidewalls of the bit lines.

12. The method of claim 11, further comprising forming a conductive layer on the third insulating layer, wherein the conductive layer fills the band-type openings and is electrically connected to the first contact pads, wherein forming the conductive layer comprises planarizing the conductive layer until the upper surface of the capping insulating layer is exposed.

13. A method of manufacturing a semiconductor device, the method comprising:

forming gate lines on a semiconductor substrate;

forming a first insulating layer between the gate lines;

forming first contact pads and second contact pads between the gate lines and in the first insulating layer to be electrically connected to a surface of the semiconductor substrate;

forming a second insulating layer overlying the first and second contact pads;

forming bit lines on the second insulating layer, the bit lines extending across the gate lines and electrically connected to the second contact pads through the second insulating layer;

forming a third insulating layer overlying the bit lines;

forming zigzag-shaped band-type openings by selectively etching a portion of the third insulating layer, wherein the band-type openings extend in a lengthwise direction of the gate lines to expose the first contact pads;

forming a conductive layer on the third insulating layer to fill the band-type openings, the conductive layer electrically connected to the first contact pads;

separating the conductive layer into individual storage node contact bodies; and forming storage nodes on the storage node contact bodies.

14. The method of claim 13, wherein the band-type openings have a pair of a protruding portion and a concave portion, in a lengthwise direction of the bit lines, the protruding portion facing the concave portion between the bit lines.

15. The method of claim 13, wherein forming band-type openings comprises forming band-type openings that are serpentine in shape, wherein an outermost and innermost edge of the band-type openings are positioned between the bit lines.

16. The method of claim 13, wherein the openings has a bottom portion with a line width that is less than a line width of an upper portion of the openings so as to have oblique sidewalls.

17. The method of claim 16, wherein the openings extend such that the upper portion of the openings overlaps an upper portion of the gate lines at the protruding portions.

18. The method of claim 16, wherein the openings extend such that the upper portion of the openings partially overlaps an upper portion of the second contact pads, between which each gate line is positioned, at the protruding portions.

19. The method of claim 16, wherein forming band-type openings comprises using taper etching to make the sidewalls of the opening oblique.

20. The method of claim 13, further comprising:

forming a capping insulating layer to cover the bit lines; and forming spacers to cover the sidewalls of the bit lines.

21. The method of claim 20, wherein forming the conductive layer comprises planarizing the conductive layer until the upper surface of the capping insulating layer is exposed.

22. The method of claim 13, wherein forming storage nodes on the storage node contact bodies comprises forming adjacent storage nodes, between which each bit line is positioned, the storage nodes arranged in a direction diagonal to the lengthwise direction of the bit line.

23. The method of claim 13, wherein the storage nodes are formed in the shape of cylinders having circular or rectangular areas.

24. The method of claim 23, further comprising forming a buffer layer to cover lower sides of the cylindrical storage nodes.

25. The method of claim 13, wherein an edge-to-edge width of the band-type openings is constant, and wherein a position of the edges of the band-type openings varies along the lengthwise direction of the gate lines.

* * * * *

UNITED STATES PATENT AND TRADEMARK OFFICE
CERTIFICATE OF CORRECTION

PATENT NO. : 6,929,999 B2 Page 1 of 1
APPLICATION NO. : 10/759802
DATED : August 16, 2005
INVENTOR(S) : Park et al.

It is certified that error appears in the above-identified patent and that said Letters Patent is hereby corrected as shown below:

At column 14, line 53, please replace "walls of the opening oblique" with --walls of the openings oblique--

Signed and Sealed this

Twenty-second Day of August, 2006

JON W. DUDAS
*Director of the United States Patent and Trademark Office*